United States Patent [19]
Noto et al.

[11] Patent Number: 5,151,672
[45] Date of Patent: Sep. 29, 1992

[54] TRAP CIRCUIT COMPRISING PLURAL PIEZOELECTRIC RESONATORS INTERCONNECTED BY PLURAL RESISTORS AND AN INDUCTOR

[75] Inventors: Kazuyuki Noto, Kurobe; Isao Toyoshima, Ishikawa, both of Japan

[73] Assignee: Murata Manufacturing Co., Nagaokakyo, Japan

[21] Appl. No.: 627,025

[22] Filed: Dec. 13, 1990

[30] Foreign Application Priority Data

Dec. 14, 1989 [JP] Japan ................... 1-325383

[51] Int. Cl.$^5$ .......................................... H03H 9/58
[52] U.S. Cl. ............................... 333/189; 333/192
[58] Field of Search ................... 333/187–192; 310/320

[56] References Cited

U.S. PATENT DOCUMENTS

| | | | |
|---|---|---|---|
| 3,566,314 | 2/1971 | Bies | 333/190 |
| 3,633,134 | 1/1972 | Barrows et al. | 333/192 |
| 3,727,154 | 4/1973 | Dailing et al. | 333/191 |
| 4,196,407 | 4/1980 | Masaie et al. | 333/191 |
| 4,423,394 | 12/1983 | Kinsman | 333/191 X |
| 4,651,109 | 3/1987 | Inoue | 333/189 X |

FOREIGN PATENT DOCUMENTS

| | | | |
|---|---|---|---|
| 84609 | 5/1982 | Japan | 333/187 |
| 47319 | 3/1983 | Japan | 333/191 |
| 61-296809 | 12/1986 | Japan . | |

Primary Examiner—Eugene R. LaRoche
Assistant Examiner—Benny Lee
Attorney, Agent, or Firm—Heller, Ehrman, White & McAuliffe

[57] ABSTRACT

In a trap circuit a plurality of cascade-connected three-terminal piezoelectric ceramic resonators having different resonance frequencies, an inductor is connected between input and output terminals of only the resonator having the lowest resonance frequency, and a resistor is connected between input and output terminals of each remaining resonator, so that large attenuation is attained at the respective resonance frequencies and a large attenuation is attained in intermediate regions between the resonance frequencies. Thus, unwanted signals can be eliminated over a large bandwidth.

3 Claims, 3 Drawing Sheets

TRAP CIRCUIT COMPRISING PLURAL PIEZOELECTRIC RESONATORS INTERCONNECTED BY PLURAL RESISTORS AND AN INDUCTOR

BACKGROUND OF THE INVENTION

1. Field of the Invention

The present invention relates to a trap circuit for eliminating a specific frequency signal included in an input signal, and more particularly, it relates to a trap circuit which is formed with a plurality of cascade-connected three-terminal ceramic resonators.

2. Description of the Background Art

In order to prevent a picture fault caused by a sound signal, a sound signal trap circuit corresponding to its frequency is provided in a picture signal circuit for a television receiver.

FIG. 4 shows an exemplary trap circuit $T_1$, which is included in a television receiver, provided on a front stage of a picture-amplification circuit 13. A picture signal supplied from a picture circuit is received through an input terminal 10 of the trap circuit $T_1$, and inputted to the picture-amplification circuit 13 through a series circuit which is defined by a resistor 11 and an inductor 12. Input and output terminals of a three-terminal piezoelectric ceramic resonator 14 are connected to both ends of the inductor 12, while a common terminal of the resonator 14 is grounded. A resistor 15 is connected between the output terminal of the resonator 14 and the ground. An output end of the picture-amplification circuit 13 is connected to a color demodulator circuit 16, whose output end is connected to a cathode-ray tube 17.

When such a trap circuit $T_1$ is formed with a single inductor 12 and a single resonator 14 in this manner, its attenuation amount is extremely reduced in ranges outside the resonance frequency $f_0$ of the resonator 14, at which large attenuation amount is attained, as shown in FIG. 5. If such a trap circuit $T_1$ employs a resonator with resonance frequency of $f_0 = 4.5$ MHz, for example, it is impossible to significantly attenuate a disturbing signal caused by FM signals such as the "Educational FM" signal, which is in a frequency domain higher than 4.5 MHz, level, although a sound signal of 4.5 MHz can be effectively eliminated. (By the "Educational FM" is meant the FM frequency band of 88.1–91.9 MHz, to be reserved for non-profit educational programs in Japan according to a recommended design guideline by the Electronic Industries Association. On TV receivers, this appears as disturbing signals at 4.85 MHz and thereabove with intervals of 0.35 MHz. Even if trap resonators corresponding to these frequencies are provided, they alone cannot attenuate near-by disturbing signals to the level of about 20 dB.) Although it is possible to construct a trap circuit for each disturbing signal, a large number of parts as well as a large substrate are required for such a circuit.

In order to attenuate a plurality of disturbing signals by a single trap circuit, it may be attempted, as shown in FIG. 6 as a hypothetical example, to form a trap circuit $T_2$ by connecting between an input terminal (IN) and an output terminal (OUT) a plurality of inductors $L_1$, $L_2$ and $L_3$ in series with a plurality of resistors $R_1$, $R_2$ and $R_3$, and connecting resonators $t_1$, $t_2$ and $t_3$ having different resonance frequencies in parallel with the respective inductors. In FIG. 6, $R_a$ and $R_b$ denote parallel resistors, and GND indicates ground terminals. In this hypothetical example, large attenuation can be attained at resonance frequencies $f_1$, $f_2$ and $f_3$ of the resonators $t_1$, $t_2$ and $t_3$, as shown in FIG. 7.

The circuit constants of such a trap circuit $T_2$ may, for example, be as follows:

$f_1$: 4.5 MHz
$f_2$: 4.85 MHz
$f_3$: 5.42 MHz
$I_{m1}$: 280 ohms
$I_{m2}$: 240 ohms
$I_{m3}$: 245 ohms
$L_1$ to $L_3$: 10 microhenries each
$R_a$: 50 ohms
$R_b$: 560 ohms
$R_1$: 150 ohms
$R_2$: 47 ohms
$R_3$: 560 ohms where $I_{m1}$ to $I_{m3}$ represent impedance across input and output terminals of the resonators $t_1$ to $t_3$ and the ground.

When the inductors and the resonators are cascade-connected in this manner, however, the attenuation is reduced by peaking at intermediate regions between the resonance frequencies $f_1$, $f_2$ and $f_3$, and hence it is impossible to continuously attain attenuation of about 20 dB, which is generally required for effectively eliminating or suppressing a disturbing signal caused by FM signals such as "Educational FM" signal. Thus, it has been impossible to simultaneously eliminate a disturbing signal having a specific frequency $f_1$ and those in intermediate regions between the resonance frequencies $f_2$ and $f_3$.

SUMMARY OF THE INVENTION

A principal object of the present invention is to provide a trap circuit with a simple circuit structure, which can eliminate a specific frequency signal and simultaneously attenuate signals in a frequency domain higher than this specific frequency.

Another object of the present invention is to provide a trap circuit which is easy to adjust and can be manufactured inexpensively.

In order to attain the aforementioned objects, a trap circuit according to the present invention may be characterized as being formed with a plurality of cascade-connected three-terminal piezoelectric ceramic resonators of different resonance frequencies for eliminating specific frequency signals which are included in an input signal, and an inductor is connected between input and output terminals of the resonator having the lowest resonance frequency, while resistors are connected between input and output terminals of the remaining resonators.

When a plurality of inductors are cascade-connected with a plurality of three-terminal piezoelectric ceramic resonators, attenuation is reduced by peaking in intermediate regions between the resonance frequencies, due to connection with inductors. If such inductors are replaced by resistors, the aforementioned reduction of the attenuation is suppressed in the intermediate regions between the resonance frequencies. According to the present invention, therefore, resistors are connected in place of inductors except for the one which is in parallel with the resonator having the lowest resonance frequency. Thus, it is possible to continuously attain large attenuation over a large frequency domain higher than a specific frequency. The inductor which is in parallel with the resonator having the lowest frequency is left because, if this inductor were also replaced by a resistor, the (shoulder-like) change characteristic of attenuation at the lowest frequency would be so deteriorated that the trap circuit would trap only signals in a range lower than the lowest frequency.

The trap bandwidth can be freely adjusted by selecting the numbers of resonators and resistors which are cascade-connected with each other.

It is possible to further suppress the peaking in the intermediate regions between the resonance frequencies by increasing the resistance of the resistors which are connected in parallel with the resonators. If the resistance is excessively increased, however, the attenuation characteristics may be adversely affected especially in the lowest resonance frequency region.

Inductors have such disadvantages that it is necessary to adjust inductances and the component costs are high. In the trap circuit according to the present invention, only the resonator having the lowest frequency is connected in parallel with such an inductor and the remaining resonators are connected in parallel with unregulated resistors, whereby adjustment is simplified as compared with the trap circuit shown in FIG. 6, which is formed by connecting all resonators with inductors, and the cost can be reduced.

These and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
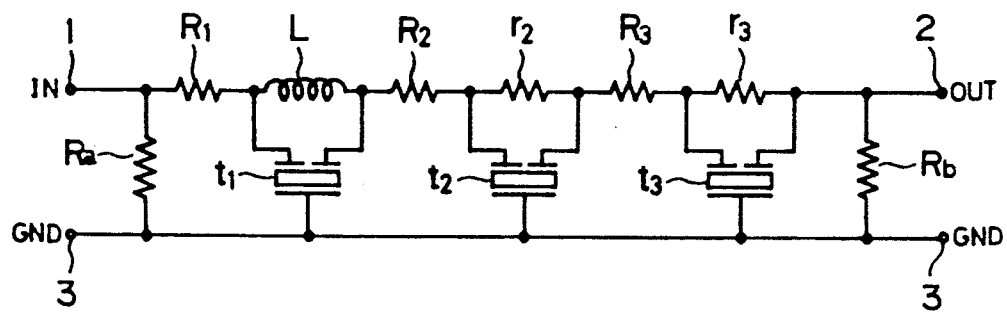
FIG. 1 is a circuit diagram showing an embodiment of a trap circuit according to the present invention.

FIG. 1 shows an embodiment of a trap circuit according to the present invention. This circuit is formed by three resonators $t_1$ to $t_3$, which are cascade-connected with each other.

Three resistors $R_1$, $R_2$ and $R_3$, two resistors $r_2$ and $r_3$ and one inductor L are connected in series between an input terminal (IN) 1 and an output terminal (OUT) 2. In further detail, the inductor L is connected between the resistors $R_1$ and $R_2$, and the resistor $r_2$ is connected between the resistors $R_2$ and $R_3$, while the resistor $r_3$ is connected between the resistor $R_3$ and the output terminal 2. Parallel resistors $R_a$ and $R_b$ are respectively connected between the input terminal 1 and a ground terminal (GND) 3, as well as between the output terminal 2 and the ground terminal 3. Input and output terminals of the first-stage piezoelectric ceramic resonator (resonator having the lowest resonance frequency) $t_1$ are connected to both ends of the inductor L, while input and output terminals of the resonators $t_2$ and $t_3$ are connected across the resistances $r_2$ and $r_3$, respectively. Common terminals of the resonators $t_1$, $t_2$ and $t_3$ are connected with the ground terminal 3. The resonators $t_1$ to $t_3$ are formed of well-known three-terminal piezoelectric ceramic resonators. In more concrete terms, the resonators $t_1$ to $t_3$ are formed of energy trapped type resonators vibrating in the thickness shear slide mode, which have resonance frequencies $f_1$, $f_2$ and $f_3$ of 4.5 MHz, 4.85 MHz and 5.42 MHz, respectively.

Figure 6:
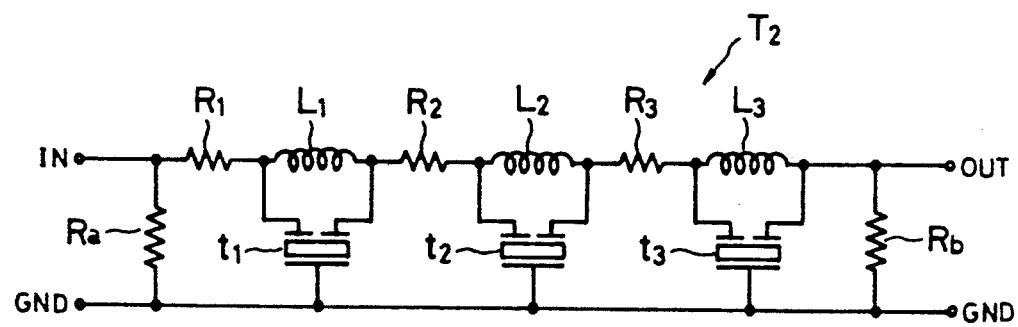
FIG. 6 is a circuit diagram of a hypothetical trap circuit which is considered herein for the purpose of comparing with the present invention.
Figure 7:
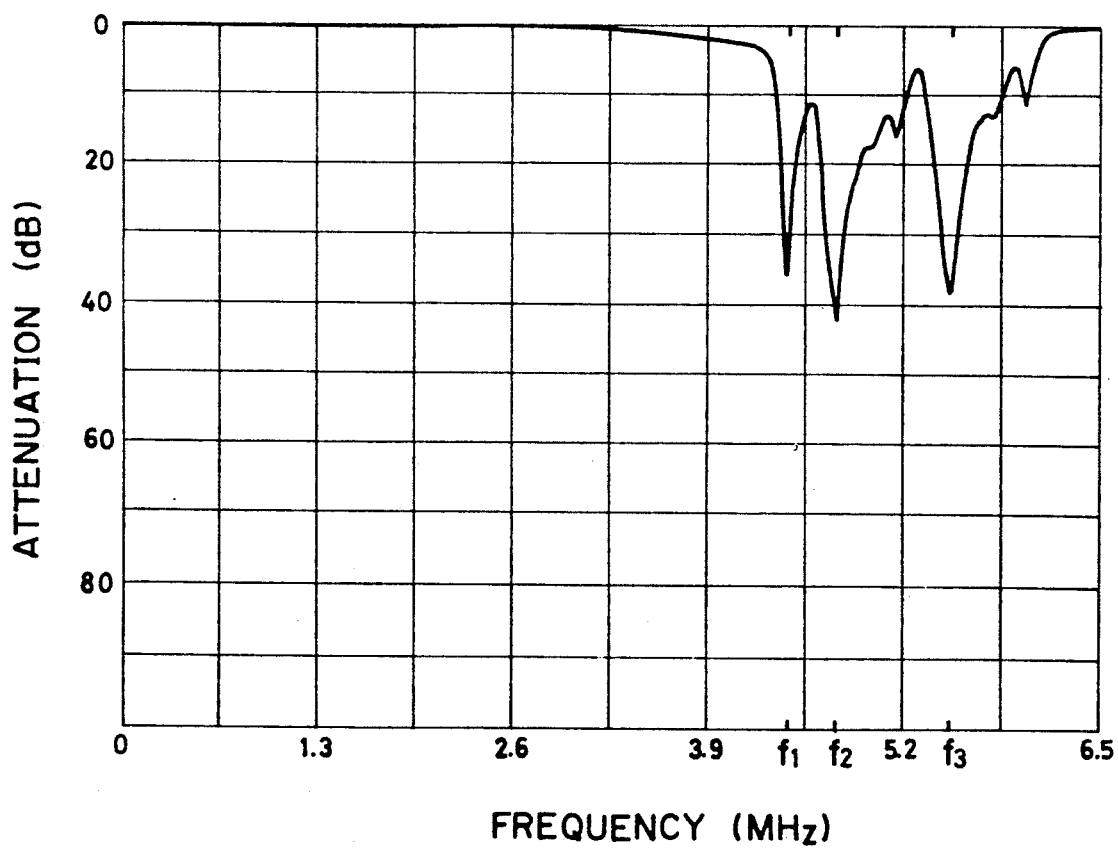
FIG. 7 is an attenuation characteristic diagram of the circuit shown in FIG. 6.

Circuit constants of this trap circuit are identical to those of the trap circuit $T_2$ shown in FIG. 6, except $L_1$, $L_2$ and $L_3$ are replaced by L, $r_2$ and $r_3$ respectively. The values of L, $r_2$ and $r_3$ are as follows:

L: 10 microhenries
$r_2$: 22 ohms
$r_3$: 470 ohms

Figure 2:
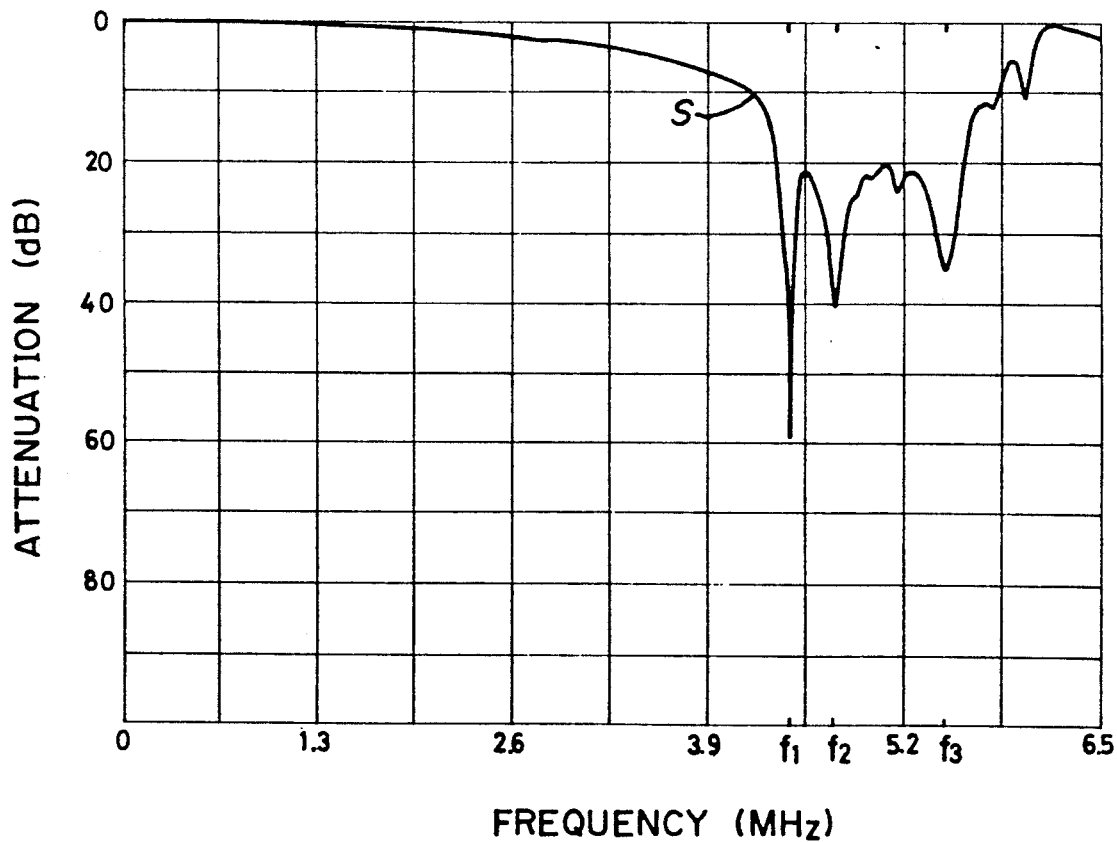
FIG. 2 is an attenuation characteristic diagram of the embodiment.

FIG. 2 shows attenuation characteristics of the aforementioned trap circuit. As clearly understood from FIG. 2, a sound signal of 4.5 MHz can be effectively eliminated since a large attenuation is attained at the resonance frequency $f_1$, while reduction of the attenuation amounts caused by peaking in intermediate regions between the resonance frequencies $f_2$ and $f_3$ is suppressed, whereby attenuation amounts of at least 20 dB can be continuously attained. Thus, it is possible to eliminate or reduce a disturbing signal caused by FM signals such as the "Educational FM" signal, which is received at intervals of 200 kHz from 4.85 MHz. Further, since the inductor L is connected in parallel with the first-stage ceramic resonator $t_1$, it is possible to ensure a steep change characteristic of the attenuation at the frequency $f_1$, i.e., a sharp shoulder characteristic shown by s in FIG. 2. If the trap circuit of the invention is provided in a picture signal circuit for a television receiver, therefore, substantially no harmful effect is produced on a picture signal having a frequency of less than 4.5 MHz.

Figure 3:
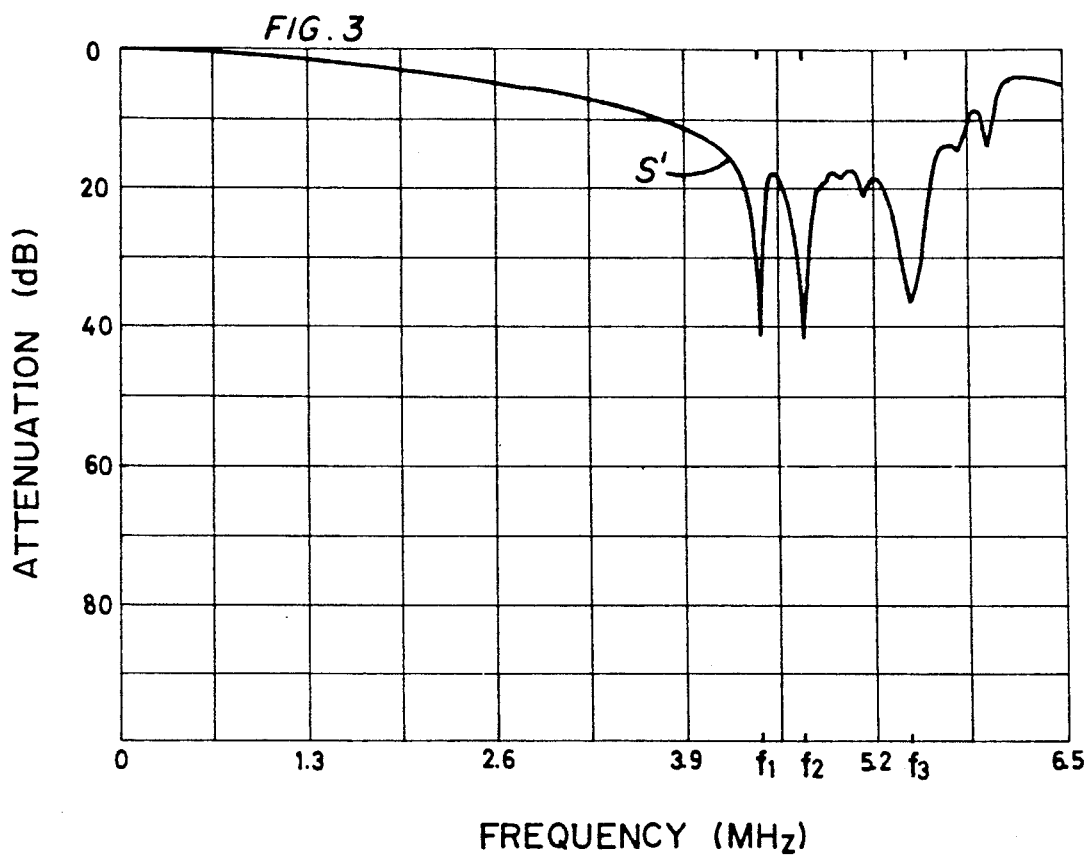
FIG. 3 is an attenuation characteristic diagram of reference example, in which all inductors are replaced by resistors.
Figure 4:
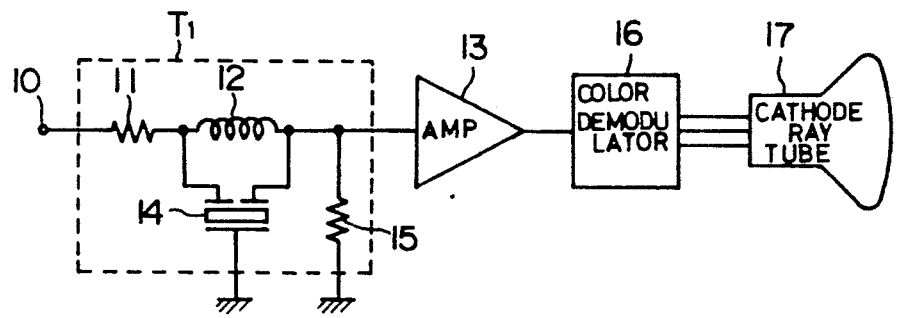
FIG. 4 is a circuit diagram of a well-known picture signal circuit for a television receiver.
Figure 5:
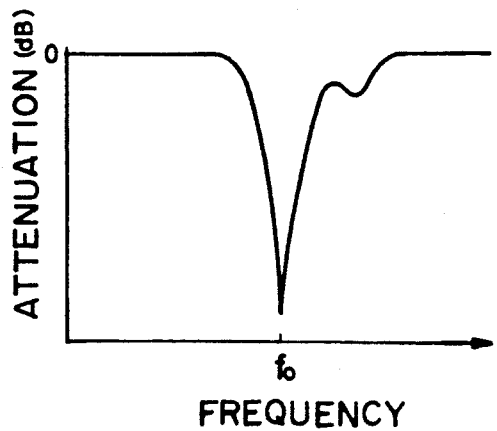
FIG. 5 is an attenuation characteristic diagram of the circuit shown in FIG. 4.

If a resistor of 22 ohms is connected in place of the aforementioned inductor L, the attenuation at the frequency $f_1$ is reduced and a shoulder characteristic s' in a region lower than the frequency $f_1$ is blunted to provide attenuation of at least 10 dB at 3.9 MHz, as shown in FIG. 3. Further, the attenuation in the intermediate regions between the resonance frequencies is less than 20 dB. Such attenuation characteristics are not desirable.

The resistance of the resistors $r_2$ and $r_3$ has effects on the attenuation in regions around the frequencies $f_2$ and $f_3$ of the resonators which are connected in parallel therewith. Thus, it is possible to increase the attenuation in the regions around the frequencies $f_2$ and $f_3$ by increasing the resistance of the resistors $r_2$ and $r_3$. If their resistance is excessively increased, however, the attenuation characteristic essentially required at the frequency $f_1$ is undesirably depressed. According to this embodiment, the resistance of the resistor $r_3$ is made larger than that of the resistor $r_2$ to increase the attenuation in the intermediate region between 4.85 MHz and 5.42 MHz, as well as to reduce their effects on the region lower than 4.5 MHz. The resistor $r_2$ may substantially have a resistance value of zero.

The inductive of the inductor L is related to the number of the cascade-connected resonators. In other words, the inductance of the inductor L, which is connected to the resonator having the lowest frequency, should preferably be reduced as the number of the cascade-connected resonators is increased in order to attain improved shoulder characteristics.

The present invention is not restricted to the above embodiment, but various modifications are available within the scope of the present invention.

For example, although the first-stage resonator $t_1$ which is closest to the input terminal 1 has the lowest frequency $f_1$ and the resonators $t_2$ and $t_3$ which are closer to the output terminal 2 have higher frequencies $f_2$ and $f_3$ in this order in the aforementioned embodiment, the present invention is not so restricted. Further, the number of the resonators is not restricted to three, but the resonators can be provided in any plural number. When n resonators (n: integer of at least two) are employed, for example, the trap circuit according to this invention requires n series resistors R, two parallel resistors $R_a$ and $R_b$, one inductor L, and (n−1) resistors r.

What is claimed is:

1. A trap circuit for eliminating unwanted signals with specific frequencies from an incoming signal, said trap circuit comprising:

an input end through which said incoming signal is received;

an output end;

a plurality of three-terminal piezoelectric ceramic resonators each having an input terminal, an output terminal and a grounded common terminal, each of said resonators having a different resonance frequency, the input and output terminals of said resonators being coupled in cascade between said input and output ends;

an input-end parallel resistor connecting said input end with said grounded common terminals;

an input-end series resistor connecting said input end with the input terminal of one of said resonators;

an output-end parallel resistor connecting said output end with said grounded common terminals;

one or more inter-resonator resistors;

one or more inter-terminal resistors; and an inductor;

one of said plurality of resonators having a lowest resonance frequency and having said inductor connected between its input and output terminals, the rest of said resonators each having one of said inter-terminal resistors connected between its input and output terminals, the input and output terminals of each mutually adjacent pair of said resonators being connected by one of said inter-resonator resistors.

2. The trap circuit of claim 1 wherein said plurality of resonators are connected in an ascending order of resonance frequencies from said input end to said output end, said one resonator having the lowest resonance frequency being the closest to said input end.

3. The trap circuit of claim 1 wherein said plurality of resonators include a first resonator, a second resonator and a third resonator having resonance frequencies of about 4.5 MHz, 4.85 MHz and 5.42 MHz, respectively, the inter-terminal resistor between the input and output terminals of said third resonator having a greater resistance value than a resistance value of the inter-terminal resistor between the input and output terminals of said second resonator.

* * * * *